United States Patent
Tani

(10) Patent No.: US 10,886,895 B2
(45) Date of Patent: Jan. 5, 2021

(54) LADDER-TYPE FREQUENCY-VARIABLE FILTER, MULTIPLEXER, RADIO-FREQUENCY FRONT END CIRCUIT, AND COMMUNICATION TERMINAL

(71) Applicant: Murata Manufacturing Co., Ltd., Kyoto (JP)

(72) Inventor: Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 97 days.

(21) Appl. No.: 16/244,379

(22) Filed: Jan. 10, 2019

(65) Prior Publication Data

US 2019/0149130 A1 May 16, 2019

Related U.S. Application Data

(63) Continuation of application No. PCT/JP2017/023481, filed on Jun. 27, 2017.

(30) Foreign Application Priority Data

Jul. 15, 2016 (JP) .................................. 2016-139909

(51) Int. Cl.
*H03H 9/64* (2006.01)
*H04B 1/525* (2015.01)
(Continued)

(52) U.S. Cl.
CPC ........ *H03H 9/6483* (2013.01); *H03H 9/0004* (2013.01); *H03H 9/542* (2013.01);
(Continued)

(58) Field of Classification Search
CPC .... H03H 9/6483; H03H 9/0004; H03H 9/542; H03H 9/6403; H03H 9/72; H03H 9/725;
(Continued)

(56) References Cited

U.S. PATENT DOCUMENTS 5,559,481 A * 9/1996 Satoh .................... H03H 9/0576
333/193
9,698,756 B2 * 7/2017 Khlat ..................... H03H 9/542
(Continued)

FOREIGN PATENT DOCUMENTS

JP 2009-207116 A 9/2009
JP 2016-504872 A 2/2016
(Continued)

OTHER PUBLICATIONS

International Search Report for International Application No. PCT/JP2017/023481, dated Sep. 5, 2017.
(Continued)

*Primary Examiner* — Benny T Lee
*Assistant Examiner* — Hafizur Rahman
(74) *Attorney, Agent, or Firm* — Pearne & Gordon LLP

(57) ABSTRACT

Even when frequency characteristics are changed in association with multiple communication bands, an attenuation required for a specific frequency band outside a pass band is obtained. A frequency-variable filter (10) includes multiple series-arm resonators (111, 112, 113), multiple parallel-arm resonators (121, 122, 123), a variable capacitor (21), and an inductor (31) having a fixed inductance. The multiple series-arm resonators (111, 112, 113) and the multiple parallel-arm resonators (121, 122, 123) are connected in a ladder shape. The variable capacitor (21) is connected in series with the parallel-arm resonator (121). The fixed inductor (31) is connected in series with the parallel-arm resonator (123).

15 Claims, 7 Drawing Sheets

(51) Int. Cl.
  *H03H 9/72* (2006.01)
  *H03H 9/54* (2006.01)
  *H03H 9/00* (2006.01)
  *H04B 1/40* (2015.01)
  *H04J 1/02* (2006.01)
  *H04B 1/00* (2006.01)

(52) U.S. Cl.
  CPC ............ *H03H 9/6403* (2013.01); *H03H 9/72* (2013.01); *H03H 9/725* (2013.01); *H04B 1/40* (2013.01); *H04B 1/525* (2013.01); *H04J 1/02* (2013.01); *H04B 1/0067* (2013.01)

(58) Field of Classification Search
  CPC ........ H04B 1/40; H04B 1/525; H04B 1/0067; H04J 1/02
  USPC .......................................................... 333/133
  See application file for complete search history.

(56) References Cited

U.S. PATENT DOCUMENTS 9,941,859 B2 * 4/2018 Endo ...................... H03H 9/725
2009/0201104 A1 8/2009 Ueda et al.
2014/0354512 A1 12/2014 Kadota
2015/0022283 A1 1/2015 Watanabe
2015/0042417 A1 * 2/2015 Onodera .............. H03H 9/6479
  333/195
2015/0171914 A1 * 6/2015 Desclos ............... H04B 1/0458
  455/77
2015/0310987 A1 10/2015 Kiwitt et al.
2016/0301383 A1 10/2016 Tani
2016/0352310 A1 12/2016 Tani et al.

FOREIGN PATENT DOCUMENTS

| WO | 2013/154113 A1 | 10/2013 |
| WO | 2015/099105 A1 | 7/2015 |
| WO | 2015/119176 A1 | 8/2015 |
| WO | 2013/125360 A1 | 8/2018 |

OTHER PUBLICATIONS

Written Opinion for International Application No. PCT/JP2017/023481, dated Sep. 5, 2017.

* cited by examiner

LADDER-TYPE FREQUENCY-VARIABLE FILTER, MULTIPLEXER, RADIO-FREQUENCY FRONT END CIRCUIT, AND COMMUNICATION TERMINAL

This is a continuation of International Application No. PCT/JP2017/023481 filed on Jun. 27, 2017 which claims priority from Japanese Patent Application No. 2016-139909 filed on Jul. 15, 2016. The contents of these applications are incorporated herein by reference in their entireties.

FIELD OF THE DISCLOSURE

The present disclosure relates to a ladder-type frequency-variable filter having adjustable frequency characteristics, and a multiplexer, a radio-frequency front end circuit and a communication terminal, each of which includes the ladder-type frequency-variable filter.

DESCRIPTION OF THE RELATED ART

Frequency-variable filters implement filter processing for communication bands of different frequency bands. A ladder-type frequency-variable filter described in Patent Document 1 has a configuration in which multiple series-arm resonators and multiple parallel-arm resonators are connected in a ladder shape.

A variable capacitor is connected to at least one of the multiple parallel-arm resonators. When the capacitance of the variable capacitor is varied, the frequency of the pass band is varied. When the pass band varies, the attenuation characteristics also vary.

Patent Document 1: International Publication WO 2015/099105

BRIEF SUMMARY OF THE DISCLOSURE

However, in the case where the ladder-type frequency-variable filter described in Patent Document 1 is implemented by, for example, a circuit substrate in which conductor patterns are formed, more than a few floating inductors are connected in series with a parallel-arm resonator, between the parallel-arm resonator and the ground. Furthermore, in order to achieve the desired attenuation characteristics at both ends of the pass band, an inductor may be connected in series with the parallel-arm resonator.

As described above, with the configuration of the ladder filter that includes a series circuit including a parallel-arm resonator and an inductor, an attenuation pole is generated, by sub-resonance of the series circuit including the parallel arm and the inductor, to appear in a harmonic region (a region on a radio-frequency side) of the pass band formed by the ladder filter. Sub-resonance in the present disclosure represents LC series resonance of a capacitive capacitance of a resonator and an inductance of an inductor or LC series resonance of an inductive inductance of a resonator and a capacitance of a capacitor. When a variable impedance element such as a variable capacitor or a variable inductor is connected in series with a series circuit including a parallel-arm resonator and an inductor, the variations in the capacitance of the variable capacitor or the inductance of the variable inductor for varying the frequency of a pass band cause the frequency of sub-resonance to vary. For example, as illustrated in FIG. 2B, which will be described later, the frequency of an attenuation pole by sub-resonance varies. Therefore, as illustrated in FIG. 2B, which will be described later, an attenuation required for a specific frequency band outside the pass band may not be obtained.

Therefore, an object of the present disclosure is to achieve a ladder-type frequency-variable filter that is able to obtain an attenuation required for a specific frequency band outside the pass band even in the case where the frequency of the sub-resonance of a parallel-arm resonator is varied by a variable impedance element.

A ladder-type frequency-variable filter according to the present disclosure includes a series-arm resonator, a first parallel-arm resonator, a second parallel-arm resonator, a variable impedance element whose impedance is variable, and a first fixed inductor having a fixed inductance. The series-arm resonator, the first parallel-arm resonator, and the second parallel-arm resonator are connected in a ladder shape. The second parallel-arm resonator is connected to a parallel arm different from the first parallel-arm resonator. The variable impedance element is connected in series with the first parallel-arm resonator. No variable impedance element is connected to the second parallel-arm resonator, and the fixed inductor is connected in series with the second parallel-arm resonator.

With this configuration, a resonant frequency of the sub-resonance of the inductance of the variable impedance element and the first parallel-arm resonator moves. Alternatively, a resonant frequency of the sub-resonance of the capacitance of the variable impedance element and the first parallel-arm resonator moves. Accordingly, the position of the attenuation pole outside the pass band changes. However, by connecting the first fixed inductor to the second parallel-arm resonator and intentionally providing a sub-resonance point at which a frequency by the sub-resonance of the second parallel-arm resonator formed by the first fixed inductor does not change, an attenuation pole (attenuation pole of a fixed frequency) by the sub-resonance point can be obtained at a desired frequency outside the pass band.

Furthermore, the ladder-type frequency-variable filter may have a configuration described below. A frequency of an attenuation pole by sub-resonance of the second parallel-arm resonator formed by the first fixed inductor is close to or equal to a frequency of a harmonic of a communication signal using a pass band of a circuit of the ladder shape.

With this configuration, even when the pass band is changed in association with the multiple communication bands, a desired attenuation may be obtained for harmonic frequencies of the multiple communication bands.

Furthermore, the ladder-type frequency-variable filter may have a configuration described below. A frequency of an attenuation pole by sub-resonance of the second parallel-arm resonator formed by the first fixed inductor is close to or equal to a frequency of an attenuation pole by a sub-resonance point of the first parallel-arm resonator.

With this configuration, a decrease in an attenuation caused by the shift of the attenuation pole by the sub-resonance of the first parallel-arm resonator is suppressed by the attenuation pole by the sub-resonance of the second parallel-arm resonator.

Furthermore, the ladder-type frequency-variable filter may further include a third parallel-arm resonator included in a circuit of the ladder shape and a second fixed inductor having a fixed inductance. The third parallel-arm resonator is connected to a parallel arm different from the first parallel-arm resonator and the second parallel-arm resonator. No variable impedance element is connected to the third parallel-arm resonator, and the second fixed inductor is connected in series with the third parallel-arm resonator.

With this configuration, multiple attenuation poles having the fixed frequencies are formed outside the pass band.

Furthermore, the ladder-type frequency-variable filter may have a configuration described below. The frequency-variable filter includes a third parallel-arm resonator included in a circuit of the ladder shape. The third parallel-arm resonator is connected to a parallel arm different from the first parallel-arm resonator and the second parallel-arm resonator.

With this configuration, as described above, an attenuation pole may be formed at a desired frequency outside the pass band.

Furthermore, a multiplexer according to the present disclosure includes a first filter configured as the frequency-variable filter according to any one of the above aspects, and a second filter. The first filter and the second filter are connected to a common connection point.

With this configuration, the attenuation characteristics outside the pass band of the first filter of the multiplexer are improved.

Furthermore, preferably, the multiplexer according to the present disclosure has a configuration described below. The second filter is a filter using a resonator. The multiplexer includes a third fixed inductor. The third fixed inductor is connected between the common connection point and the second filter, and an inductance of the third fixed inductance is fixed.

With this configuration, the LC series resonance circuit including an inductive component of the third fixed inductor and a capacitive component of the second filter is connected to the first filter. Such a circuit configuration is obtained. Accordingly, an attenuation pole by the LC series resonance circuit is formed outside the pass band of the first filter.

Furthermore, preferably, the multiplexer according to the present disclosure has a configuration described below. An attenuation pole of an LC series resonance circuit including the second filter and the third fixed inductor is close to or equal to a frequency of an attenuation pole by a sub-resonance point of the first parallel-arm resonator of the first filter.

With this configuration, a decrease in the attenuation by the shift of the attenuation pole by the sub-resonance of the first parallel-arm resonator forming the first filter is suppressed by the attenuation pole by the LC series resonance circuit including the second filter and the third fixed inductor.

Furthermore, in the multiplexer according to the present disclosure, the second filter may be a longitudinally-coupled resonator filter.

With this configuration, a low impedance is achieved by the third fixed inductor. Therefore, even if the impedance of the longitudinally-coupled resonator filter increases, impedance matching can be achieved easily. Thus, the electrode width of the longitudinally-coupled resonator filter can be reduced, and the shape of the longitudinally-coupled resonator filter is made compact.

Furthermore, in the multiplexer according to the present disclosure, the first filter may be a transmission filter, and the second filter may be a reception filter.

With this configuration, the attenuation characteristics outside the pass band of the transmission filter of the multiplexer are improved.

Furthermore, in the multiplexer according to the present disclosure, the first filter may be a reception filter, and the second filter may be a transmission filter.

With this configuration, the attenuation characteristics outside the pass band of the reception filter of the multiplexer are improved.

Furthermore, a radio-frequency front end circuit according to the present disclosure includes the multiplexer described above; a transmission-side amplification circuit that is connected to the transmission filter; a reception-side amplification circuit that is connected to the reception filter; and an RFIC that is connected to the transmission-side amplification circuit and the reception-side amplification circuit.

With this configuration, a radio-frequency front end circuit having excellent characteristics not only in the pass band of the transmission filter or the reception filter but also outside the pass band can be achieved.

Furthermore, a communication terminal according to the present disclosure includes the radio-frequency front end circuit described above; and a baseband IC that is connected to the RFIC.

With this configuration, a communication terminal having excellent characteristics not only in the pass band of the transmission filter or the reception filter but also outside the pass band can be achieved.

According to the present disclosure, a ladder-type frequency-variable filter can provide an attenuation required for a specific frequency band outside the pass band even in the case where the frequency of the sub-resonance of a parallel-arm resonator is varied by a variable impedance element.

DETAILED DESCRIPTION OF THE DISCLOSURE

Figure 1A:
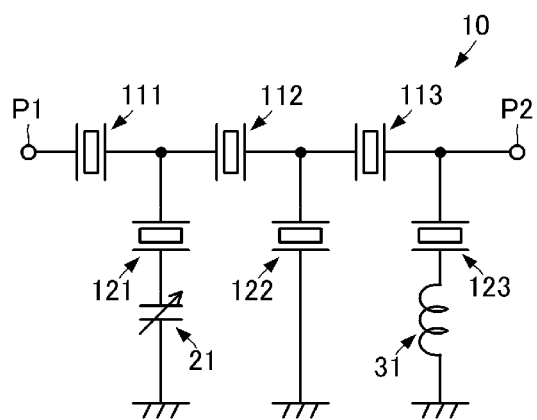
FIG. 1A is a circuit diagram of a frequency-variable filter according to a first embodiment of the present disclosure.
Figure 1B:
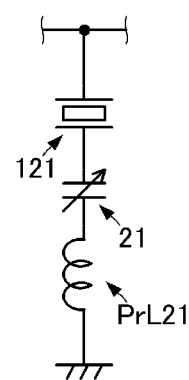
FIG. 1B is an equivalent circuit diagram of a parallel arm that includes a variable capacitor of the frequency-variable filter.

A frequency-variable filter according to a first embodiment of the present disclosure will be explained with reference to the drawings. FIG. 1A is a circuit diagram of the frequency-variable filter according to the first embodiment of the present disclosure. FIG. 1B is an equivalent circuit diagram of a parallel arm that includes a variable capacitor of the frequency-variable filter.

As illustrated in FIG. 1A), a frequency-variable filter 10 includes multiple series-arm resonators 111, 112, and 113, multiple parallel-arm resonators 121, 122, and 123, a variable capacitor 21, and an inductor 31. The frequency-variable filter 10 includes a first terminal P1 and a second terminal P2. The multiple series-arm resonators 111, 112, and 113 and the multiple parallel-arm resonators 121, 122, and 123 are, for example, piezoelectric resonators such as SAW resonators.

The variable capacitor 21 is a capacitor having a variable capacitance according to an external control signal supplied from an RFIC or a BBIC connected to the frequency-variable filter. The inductor 31 is an inductor having a fixed inductance and corresponds to a "first fixed inductor" according to the present disclosure.

The multiple series-arm resonators 111, 112, and 113 are connected in series between the first terminal P1 and the second terminal P2. The first terminal P1 is connected to the series-arm resonator 111, and the series-arm resonator 111 is connected to the series-arm resonator 112. The series-arm resonator 112 is connected to the series-arm resonator 113, and the series-arm resonator 113 is connected to the second terminal P2.

One end of the parallel-arm resonator 121 is connected to a connection line of the series-arm resonator 111 and the series-arm resonator 112. The other end of the parallel-arm resonator 121 is connected to one end of the variable capacitor 21. The other end of the variable capacitor 21 is connected to the ground. The parallel-arm resonator 121 corresponds to a "first parallel-arm resonator" according to the present disclosure.

One end of the parallel-arm resonator 122 is connected to a connection line of the series-arm resonator 112 and the series-arm resonator 113. The other end of the parallel-arm resonator 122 is connected to the ground.

One end of the parallel-arm resonator 123 is connected to a connection line of the series-arm resonator 113 and the second terminal P2. The other end of the parallel-arm resonator 123 is connected to one end of the inductor 31. The parallel-arm resonator 123 corresponds to a "second parallel-arm resonator" according to the present disclosure.

The other end of the inductor 31 is connected to the ground.

In the frequency-variable filter 10 having the above configuration, the multiple series-arm resonators 111, 112, and 113 and the multiple parallel-arm resonators 121, 122, and 123 are implemented by piezoelectric materials and conductor patterns formed at the piezoelectric materials. The variable capacitor 21 is implemented by a semiconductor component having a function for switching capacitance or a semiconductor switch and a capacitor. The inductor 31 is formed by a chip component mounted at a dielectric substrate or a conductor pattern formed at a dielectric substrate. Furthermore, the ground is implemented by connecting a ground terminal at the dielectric substrate to an external ground.

The multiple series-arm resonators 111, 112, and 113, the multiple parallel-arm resonators 121, 122, and 123, the variable capacitor 21, the inductor 31, and the ground terminal are connected by conductor patterns or the like formed at the dielectric substrate.

Not a few parasitic inductors are generated in a part where conductor patterns are formed. Therefore, as illustrated in FIG. 1B, a parasitic inductor PrL21 is further connected in series with a series circuit including the parallel-arm resonator 121 and the variable capacitor 21.

When the parasitic inductor PrL21 is connected in series with the parallel-arm resonator 121, this circuit includes a sub-resonance point, as well as a resonance point and an anti-resonance point by the parallel-arm resonator 121. The resonance point and the anti-resonance point by the parallel-arm resonator 121 contribute to the formation of a pass band for a communication band in which the filter processing by the frequency-variable filter 10 is performed. In contrast, the sub-resonance point contributes to the formation of an attenuation pole outside the pass band for the communication band.

When the capacitance of the variable capacitor 21 is changed, the frequency of the pass band is shifted. Accordingly, the filter processing for the communication signals of different frequency bands (for example, a communication band 28A and a communication band 28B) is performed. At this time, in accordance with the shift of the frequency of the pass band, the frequency of the attenuation pole by the sub-resonance point of the parallel-arm resonator 121 is also shifted. In particular, in a circuit such as the frequency-variable filter 10 according to this embodiment in which multiple series-arm resonators and parallel-arm resonators are connected in a ladder shape, the frequency of the attenuation pole is away from the pass band, and the range of the shift of the frequency of the attenuation pole is thus large.

Figure 2A:
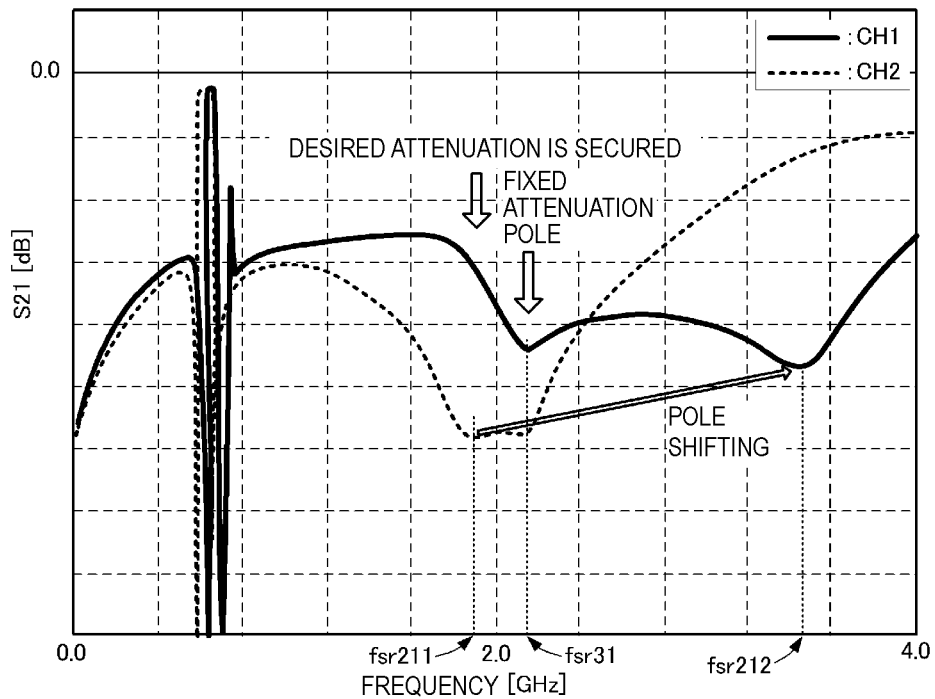
FIG. 2A is a filter characteristic diagram of the frequency-variable filter according to the first embodiment of the present disclosure.
Figure 2B:
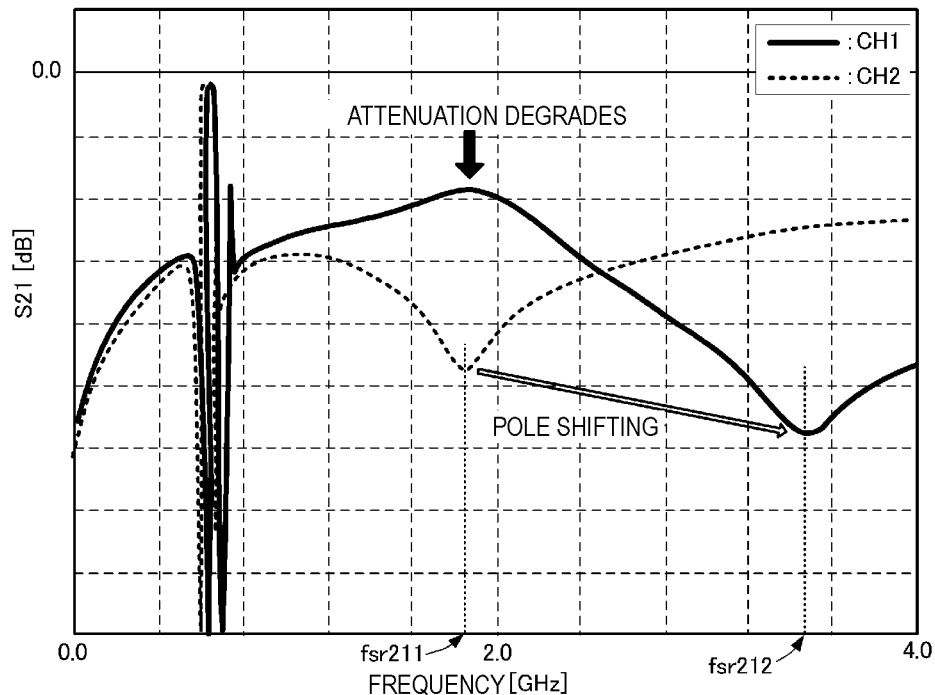
FIG. 2B is a filter characteristic diagram of a frequency-variable filter as a comparison target.

FIG. 2A is a filter characteristic diagram of the frequency-variable filter according to the first embodiment of the present disclosure. FIG. 2B is a filter characteristic diagram of a frequency-variable filter as a comparison target. In FIGS. 2A and 2B, the solid lines represent the filter characteristics of a communication band CH1, and the broken lines represent the filter characteristics of a communication band CH2. The frequency-variable filter having the filter characteristics illustrated in FIG. 2B has a known circuit configuration in which the inductor 31 is removed from the frequency-variable filter 10 according to this embodiment.

As illustrated in FIG. 2B, in the frequency-variable filter as the comparison target, when the capacitance of a variable capacitor is changed to switch between the communication bands, the pass band is shifted from a use frequency band of the communication band CH2 to the use frequency band of the communication band CH1. In accordance with this, the sub-resonance point also changes depending on whether the setting is for the communication band CH2 or for the communication band CH1. When the setting is switched from the setting for the communication band CH2 to the setting for the communication band CH1, the attenuation pole frequency is changed from an attenuation pole frequency fsr211 to an attenuation pole frequency fsr212. In the case of the attenuation pole frequency fsr212, an attenuation at a frequency corresponding to the attenuation pole frequency fsr211 degrades.

As illustrated in FIG. 2A, even in the frequency-variable filter 10 according to an embodiment of the present application, when the setting is switched from the setting for the communication band CH1 to the setting for the communication band CH2, an attenuation pole frequency changes from the attenuation pole frequency fsr211 to the attenuation pole frequency fsr212. However, the frequency-variable filter 10 includes a series circuit including the parallel-arm resonator 123 and the inductor 31. Therefore, a sub-resonance point of the parallel-arm resonator 123 is generated by the inductor 31. Accordingly, the frequency-variable filter 10 has an attenuation pole frequency fsr31 based on this sub-resonance point. No variable capacitor is connected in series with the parallel-arm resonator 123. Therefore, even if the capacitance of the variable capacitor 21 changes, the attenuation pole frequency fsr3l based on the sub-resonance point does not change.

In the frequency-variable filter 10, the attenuation pole frequency fsr3l based on the sub-resonance point of the parallel-arm resonator 123 (more accurately, a sub-resonance point based on the series circuit including the parallel-arm resonator 123 and the inductor 31) is made equal to a frequency close to a specific frequency at which the attenuation degrades as illustrated in FIG. 2B or equal to the specific frequency.

Accordingly, in the frequency-variable filter 10, even if the capacitance of the variable capacitor 21 is changed to switch between multiple communication bands, an attenuation at a specific frequency common to the multiple communication bands can be ensured.

For example, in the case where the communication band CH1 is a communication band 28B and the communication band CH2 is a communication band 28A, the use frequency band of the communication band 28A and the use frequency band of the communication band 28B are close to each other. That is, in the frequency-variable filter 10, the pass band for the communication band 28A and the pass band for the communication band 28B are close to each other. In this case, a frequency of 2-times harmonics of the communication band 28A and a frequency of 2-times harmonics of the communication band 28B are close to each other.

In the frequency-variable filter 10 and the (known) frequency-variable filter as the comparison target, at the setting for the communication band 28A, the attenuation pole frequency fsr2ll is close to or equal to frequencies of 2-times harmonics of the communication band 28A and the communication band 28B.

In this case, in the frequency-variable filter as the comparison target, when the setting is switched to the setting for the communication band 28B, an attenuation at the frequency of 2-times harmonics degrades, and an attenuation effect of the 2-times harmonics decreases. However, the frequency-variable filter 10 according to this embodiment has the attenuation pole frequency fsr3l, which is fixed. Therefore, an attenuation sufficient for 2-times harmonics can be ensured.

In the explanation provided above, the case where there are multiple communication bands 28A and 28B has been explained. However, a configuration of the present disclosure can also be applied to multiple communication bands using frequency bands that are close to each other. Furthermore, a configuration of the present disclosure may be applied to a combination of multiple communication bands in which frequencies of 2-times harmonics and frequencies of 3-times harmonics are close to or equal to each other.

Furthermore, in the explanation provided above, the case where a parasitic inductor is used has been explained. However, a configuration of the present disclosure can also be applied to a case where an inductor is connected in series with a variable capacitor and a parallel-arm resonator.

Figure 3:
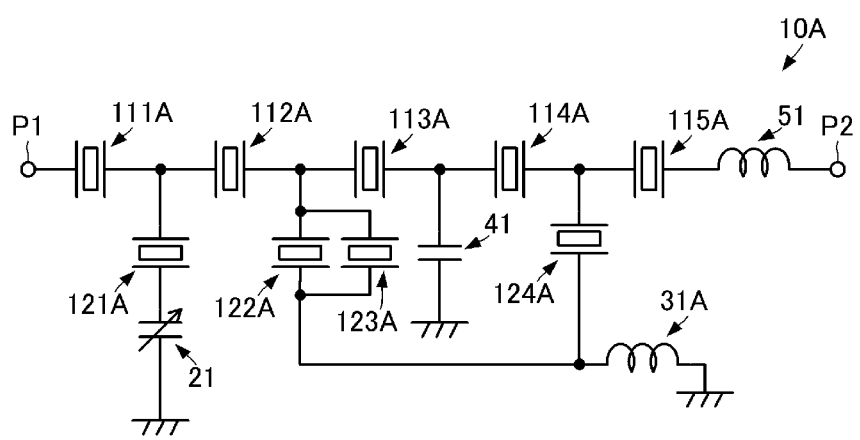
FIG. 3 is a circuit diagram of a frequency-variable filter according to a second embodiment of the present disclosure.

Next, a frequency-variable filter according to a second embodiment of the present disclosure will be explained with reference to the drawings. FIG. 3 is a circuit diagram of the frequency-variable filter according to the second embodiment of the present disclosure.

A frequency-variable filter 10A according to this embodiment is similar to the frequency-variable filter 10 according to the first embodiment in terms of the basic configuration and concept. The frequency-variable filter 10A is different from the frequency-variable filter 10 in the circuit pattern. Only differences will be specifically explained.

As illustrated in FIG. 3, the frequency-variable filter 10A includes multiple series-arm resonators 111A, 112A, 113A, 114A, and 115A, multiple parallel-arm resonators 121A, 122A, 123A, and 124A, the variable capacitor 21, an inductor 31A, a capacitor 41, and a matching inductor 51. The frequency-variable filter 10A includes the first terminal P1 and the second terminal P2.

The inductor 31A is a fixed inductor having a fixed inductance. The capacitor 41 is a fixed capacitor having a fixed capacitance.

The multiple series-arm resonators 111A, 112A, 113A, 114A, and 115A and the matching inductor 51 are connected in series between the first terminal P1 and the second terminal P2.

One end of the parallel-arm resonator 121A is connected to a connection line of the series-arm resonator 111A and the series-arm resonator 112A. The other end of the parallel-arm resonator 121A is connected to one end of the variable capacitor 21. The other end of the variable capacitor 21 is connected to the ground. The parallel-arm resonator 121A corresponds to a "first parallel-arm resonator" according to the present disclosure.

The parallel-arm resonator 122A and the parallel-arm resonator 123A are connected in parallel. One end of this parallel circuit is connected to a connection line of the series-arm resonator 112A and the series-arm resonator 113A. The other end of the parallel circuit is connected to one end of the inductor 31A. Each of the parallel-arm resonator 122A and the parallel-arm resonator 123A corresponds to a "third parallel-arm resonator" according to the present disclosure.

One end of the parallel-arm resonator 124A is connected to a connection line of the series-arm resonator 114A and the series-arm resonator 115A. The other end of the parallel-arm resonator 124A is connected to one end of the inductor 31A. The parallel-arm resonator 124A corresponds to a "second parallel-arm resonator" according to the present disclosure.

The other end of the inductor 31A is connected to the ground.

One end of the capacitor 41 is connected to a connection line of the series-arm resonator 113A and the series-arm resonator 114A. The other end of the capacitor 41 is connected to the ground.

Figure 4A:
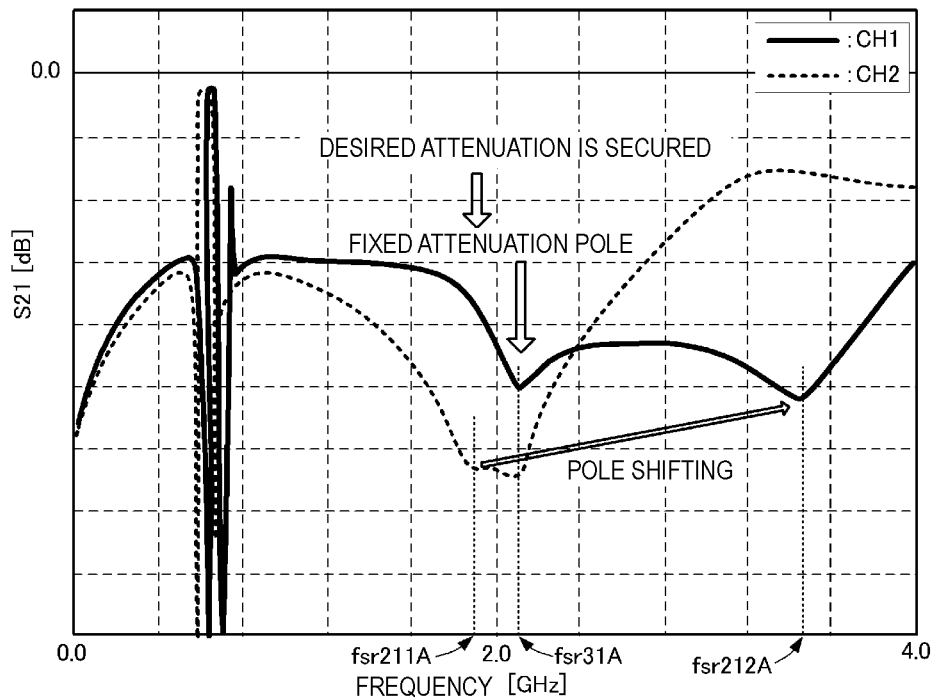
FIG. 4A is a filter characteristic diagram of the frequency-variable filter according to the second embodiment of the present disclosure.
Figure 4B:
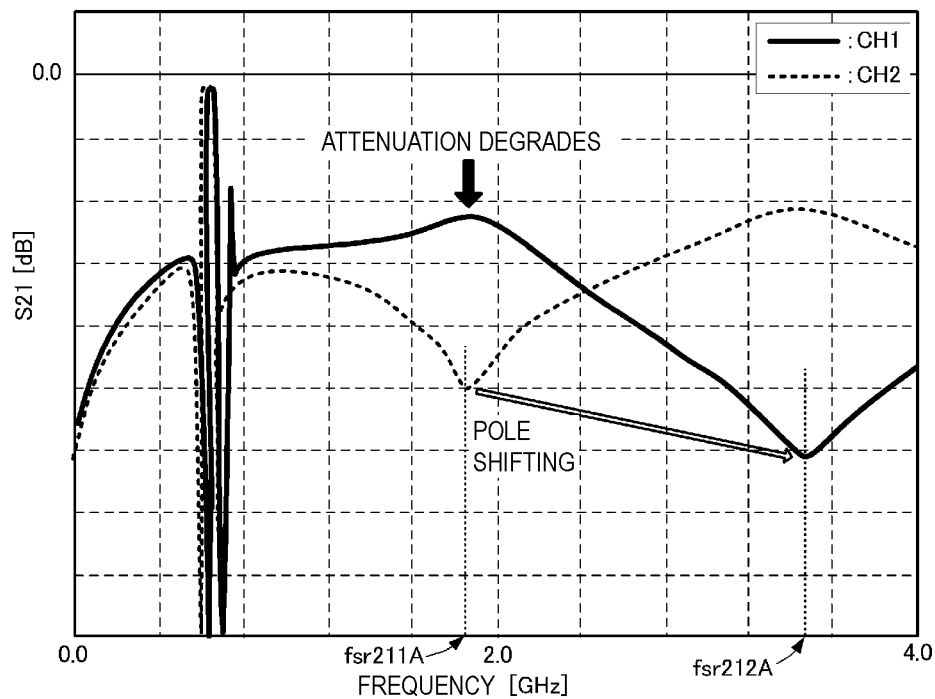
FIG. 4B is a filter characteristic diagram of a frequency-variable filter as a comparison target.

FIG. 4A is a filter characteristic diagram of the frequency-variable filter according to the second embodiment of the present disclosure. FIG. 4B is a filter characteristic diagram of a frequency-variable filter as a comparison target. In FIGS. 4A and 4B, the solid lines represent the filter characteristics of the communication band CH1, and the broken lines represent the filter characteristics of the communication band CH2. The frequency-variable filter having the filter characteristics illustrated in FIG. 4B has a known circuit configuration in which the inductor 31A is removed from the frequency-variable filter 10A according to this embodiment.

As illustrated in FIG. 4A, although the frequency-variable filter 10A according to this embodiment has the attenuation pole frequencies fsr211A and fsr212A that vary according to the capacitance of the variable capacitor 21, the attenuation pole frequency fsr31A, which is a fixed frequency close to or equal to a specific frequency, can be set, as with the frequency-variable filter 10 according to the first embodiment.

Accordingly, in the frequency-variable filter 10A, even when the capacitance of the variable capacitor 21 is changed to switch between multiple communication bands, an attenuation at a specific frequency common to the multiple communication bands can be ensured, as with the frequency-variable filter 10 according to the first embodiment.

Figure 5:
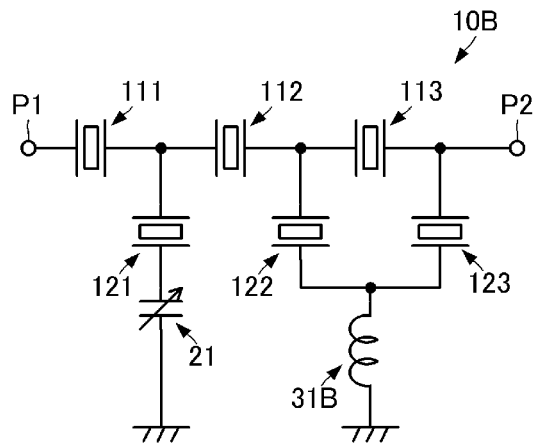
FIG. 5 is a circuit diagram of a frequency-variable filter according to a third embodiment of the present disclosure.

Next, a frequency-variable filter according to a third embodiment of the present disclosure will be explained with reference to the drawings. FIG. 5 is a circuit diagram of the frequency-variable filter according to the third embodiment of the present disclosure.

A frequency-variable filter 10B according to this embodiment is different from the frequency-variable filter 10 according to the first embodiment in a connection state of an inductor 31B. The other configuration features of the frequency-variable filter 10B are similar to those of the frequency-variable filter 10 according to the first embodiment, and the explanation for those similar configuration features will be omitted.

As illustrated in FIG. 5, the frequency-variable filter 10B includes the multiple series-arm resonators 111, 112, and 113, the multiple parallel-arm resonators 121, 122, and 123, the variable capacitor 21, and the inductor 31B. The frequency-variable filter 10B includes the first terminal P1 and the second terminal P2. The inductor 31B is a fixed inductor having a fixed inductance.

The other end of the parallel-arm resonator 122 is connected to one end of the inductor 31B. The parallel-arm resonator 122 corresponds to a "third parallel-arm resonator" according to the present disclosure. The other end of the parallel-arm resonator 123 is connected to the one end of the inductor 31B. The other end of the inductor 31B is connected to the ground. The inductor 31B corresponds to a "first fixed inductor" according to the present disclosure.

In the frequency-variable filter 10B having the above configuration, even when the capacitance of the variable capacitor 21 is changed to switch between multiple communication bands, an attenuation at a specific frequency common to the multiple communication bands can be ensured, as with the frequency-variable filter 10 according to the first embodiment.

Figure 6:
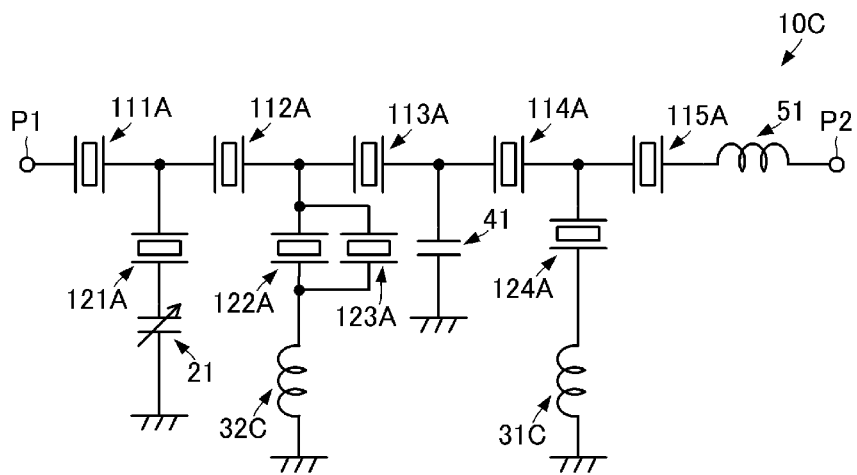
FIG. 6 is a circuit diagram of a frequency-variable filter according to a fourth embodiment of the present disclosure.

Next, a frequency-variable filter according to a fourth embodiment of the present disclosure will be explained with reference to the drawings. FIG. 6 is a circuit diagram of the frequency-variable filter according to the fourth embodiment of the present disclosure.

A frequency-variable filter 10C according to this embodiment is different from the frequency-variable filter 10A according to the second embodiment in that multiple inductors 31C and 32C are further provided. The other configuration features of the frequency-variable filter 10C are similar to those of the frequency-variable filter 10A according to the second embodiment, and the explanation for those similar configuration features will be omitted.

As illustrated in FIG. 6, the frequency-variable filter 10C includes multiple series-arm resonators 111A, 112A, 113A, 114A, and 115A, multiple parallel-arm resonators 121A, 122A, 123A, and 124A, the variable capacitor 21, the multiple inductors 31C and 32C, the capacitor 41, and the matching inductor 51.

Each of the multiple inductors 31C and 32C is a fixed inductor having a fixed inductance.

The other end of each of the parallel-arm resonator 122A and the parallel-arm resonator 123A is connected one end of the inductor 32C. The other end of the inductor 32C is connected to the ground. The inductor 32C corresponds to a "second fixed inductor" according to the present disclosure.

The other end of the parallel-arm resonator 124A is connected to one end of the inductor 31C. The other end of the inductor 31C is connected to the ground. The inductor 31C corresponds to a "first fixed inductor" according to the present disclosure.

In the frequency-variable filter 10C having the above configuration, even when the capacitance of the variable capacitor 21 is changed to switch between multiple communication bands, an attenuation at a specific frequency common to the multiple communication bands can be ensured, as with the frequency-variable filter 10A according to the second embodiment.

Furthermore, the frequency-variable filter 10C includes the multiple inductors 31C and 32C. Accordingly, this configuration is especially effective to the case where there are multiple specific frequencies requiring the desired attenuations. For example, the attenuation of the harmonics of 2-times waves (1406 to 1496 MHz) and 3-times waves (2109 to 2244 MHz) is important to a transmission (703 to 748 MHz) filter of a communication band 28. By allocating both an attenuation effect by the inductor 31C and an attenuation effect by the inductor 32C to a frequency close to the 2-times waves, a large attenuation can be ensured near the 2-times waves. Furthermore, by allocating an attenuation effect by the inductor 31C to a frequency close to 2-times waves and allocating an attenuation effect by the inductor 32C to a frequency close to the 3-times waves, attenuations in two frequency bands close to the 2-times waves and the 3-times waves can be ensured.

Figure 7:
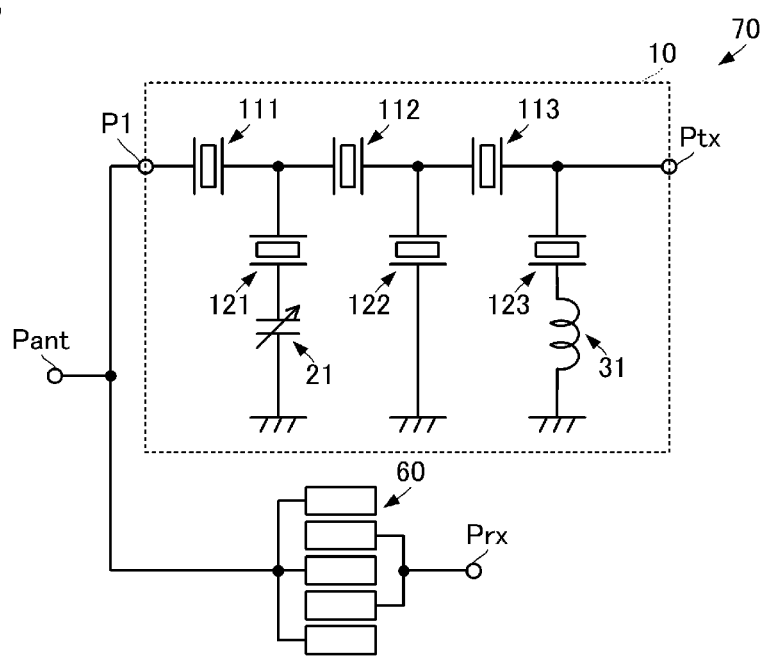
FIG. 7 is a circuit diagram of a multiplexer according to a fifth embodiment of the present disclosure.

Next, a multiplexer according to a fifth embodiment of the present disclosure will be explained with reference to the drawings. FIG. 7 is a circuit diagram of the multiplexer according to the fifth embodiment of the present disclosure.

As illustrated in FIG. 7, a multiplexer 70 includes the frequency-variable filter 10 according to the first embodiment, a reception filter 60, a transmission terminal Ptx, a reception terminal Prx, and an antenna terminal Pant.

The frequency-variable filter 10 is a transmission filter and is connected between the transmission terminal Ptx and the antenna terminal Pant. In the example illustrated in FIG. 7, the first terminal P1 of the frequency-variable filter 10A is connected to the antenna terminal Pant. The transmission terminal Ptx is a second terminal of the frequency-variable filter 10.

The reception filter 60 is a longitudinally-coupled resonator filter and is connected between the reception terminal Prx and the antenna terminal Pant.

In the multiplexer 70 having the above configuration, even when the capacitance of the variable capacitor 21 is changed to switch between the transmission signals of multiple communication bands, an attenuation at a common specific frequency outside the transmission frequency bands of the multiple communication bands can be ensured. Furthermore, the reception filter 60 may be a frequency-variable filter.

Figure 8:
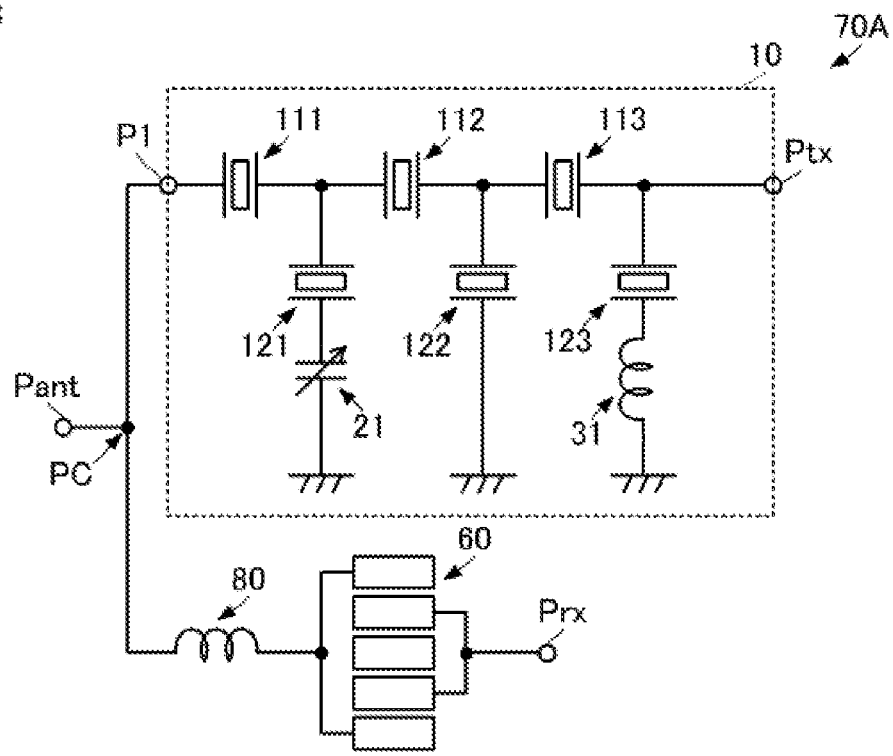
FIG. 8 is a circuit diagram of a multiplexer according to a sixth embodiment of the present disclosure.

Next, a multiplexer according to a sixth embodiment of the present disclosure will be explained with reference to the drawings. FIG. 8 is a circuit diagram of the multiplexer according to the sixth embodiment of the present disclosure.

As illustrated in FIG. 8, a multiplexer 70A according to this embodiment is different from the multiplexer 70 according to the fifth embodiment in that an inductor 80 is further provided. The other configuration features of the multiplexer 70A are similar to those of the multiplexer 70, and the explanation for those similar configuration features will be omitted.

The inductor 80 is a fixed inductor having a fixed inductance. The inductor 80 corresponds to a "third fixed inductor" according to the present disclosure. One end of the inductor 80 is connected to a common connection point PC of the frequency-variable filter 10, which is a transmission filter, and the reception filter 60. The other end of the inductor 80 is connected to the reception filter 60. In other words, the inductor 80 is connected between the common connection point PC and the reception filter 60.

The reception filter 60 includes a resonator and has C (capacitance) characteristics. Therefore, the inductor 80 and the capacitive reception filter 60 form an LC series resonance circuit. Thus, the multiplexer 70 has a circuit configuration in which the frequency-variable filter 10 is connected between the transmission terminal Ptx and the antenna terminal Pant and the LC series resonance circuit including the inductor 80 and the reception filter 60 is connected on the antenna terminal Pant side of the frequency-variable filter 10.

The resonant frequency of the LC series resonance circuit including the inductor 80 and the reception filter 60 is made close to or equal to a specific frequency outside the pass band described above. Accordingly, in the multiplexer 70, even in the case where a transmission filter is formed by the ladder-type frequency-variable filter 10, an attenuation at a specific frequency outside the pass band of a transmission signal can be ensured more reliably.

For example, in the transmission (703 to 748 MHz) filter of the communication band 28, the attenuation of the harmonics of 2-times waves (1406 to 1496 MHz) and 3-times waves (2109 to 2244 MHz) are also important. By allocating both an attenuation effect by the inductor 80 and an attenuation effect by the inductor 31 to a frequency close to the 2-times waves, a large attenuation can be ensured near the 2-times waves. Furthermore, by allocating an attenuation effect by the inductor 80 to a frequency close to 2-times waves and allocating an attenuation effect by the inductor 31 to a frequency close to the 3-times waves, attenuations in two frequency bands close to the 2-times waves and the 3-times waves can be ensured.

Furthermore, as described in this embodiment, in the case where the reception filter 60 is implemented by a longitudinally-coupled resonator filter, miniaturization can be easily achieved. Specifically, when the electrode width of a longitudinally-coupled resonator filter is decreased, the size of the reception filter 60 can be decreased, whereas the impedance of the reception filter 60 increases. However, by connecting the inductor 80 to the reception filter 60, an impedance obtained when the reception filter 60 side is viewed from the common connection point PC can be reduced, and impedance matching between the antenna terminal Pant and the reception terminal Prx can be easily achieved. Therefore, miniaturization can be achieved easily without loss being increased.

Figure 9:
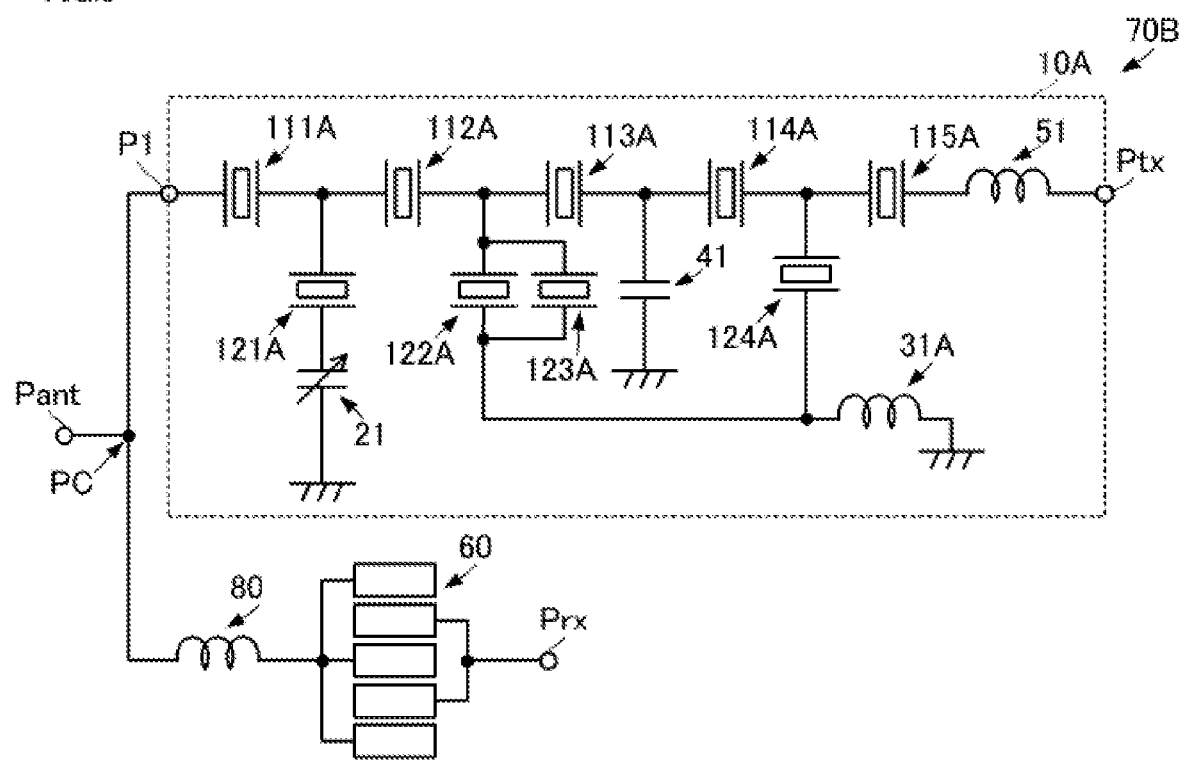
FIG. 9 is a circuit diagram of a multiplexer according to a seventh embodiment of the present disclosure.

Next, a multiplexer according to a seventh embodiment of the present disclosure will be explained with reference to the drawings. FIG. 9 is a circuit diagram of the multiplexer according to the seventh embodiment of the present disclosure.

As illustrated in FIG. 9, a multiplexer 70B according to this embodiment is different from the multiplexer 70A according to the sixth embodiment in that the frequency-variable filter 10A according to the second embodiment is used as a transmission filter. The other configuration features of the multiplexer 70B are similar to those of the multiplexer 70A, and the explanation for those similar configuration features will be omitted.

In the multiplexer 70B having the above configuration, even in the case where a transmission filter is formed by the ladder-type frequency-variable filter 10A, even when the capacitance of the variable capacitor 21 is changed to switch between transmission signals of multiple communication bands, an attenuation at a common specific frequency outside the transmission frequency bands of the multiple communication bands can be ensured, as with the multiplexer 70A according to the sixth embodiment.

Modes have been described in which the frequency-variable filter 10 according to the first embodiment is used for the multiplexers 70 and 70A according to the fifth and sixth embodiments, and the frequency-variable filter 10A according to the second embodiment is used for the multiplexer 70B according to the seventh embodiment. However, the frequency-variable filters 10B and 10C according to the third and fourth embodiments may be applied to the transmission filters of the multiplexers according to the fifth, sixth, and seventh embodiment.

Figure 10:
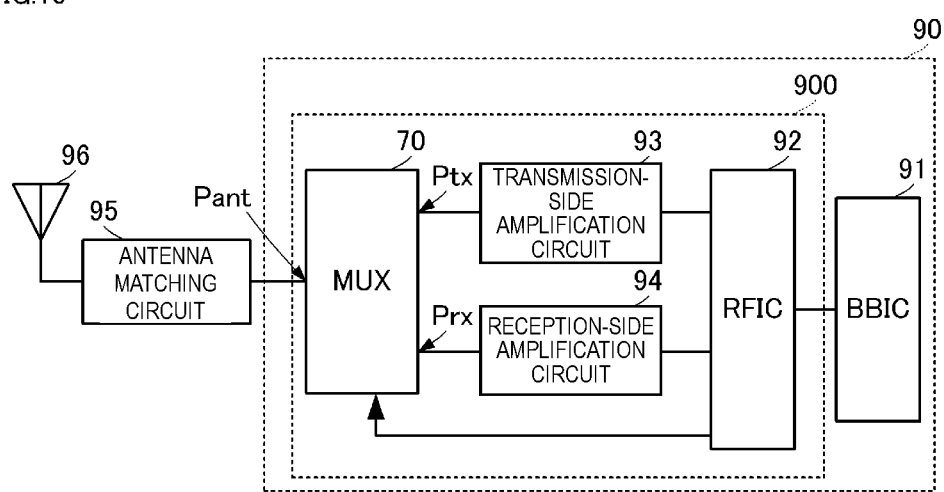
FIG. 10 is a functional block diagram of a communication terminal according to an embodiment of the present disclosure.

Next, a communication terminal according to an eighth embodiment of the present disclosure will be explained with reference to the drawings. FIG. 10 is a functional block diagram of the communication terminal according to this embodiment of the present disclosure.

A communication terminal 90 includes the multiplexer 70, a BBIC 91, an RFIC 92, a transmission-side amplification circuit 93, a reception-side amplification circuit 94, an antenna matching circuit 95, and an antenna 96. The antenna terminal Pant of the multiplexer 70 is connected to the antenna 96 with the antenna matching circuit 95 interposed therebetween. The transmission terminal Ptx of the multiplexer 70 is connected to the transmission-side amplification circuit 93. The reception terminal Prx of the multiplexer 70 is connected to the reception-side amplification circuit 94. The transmission-side amplification circuit 93 and the reception-side amplification circuit 94 are connected to the RFIC 92. The RFIC 92 is connected to the BBIC 91. The multiplexer 70, the RFIC 92, the transmission-side amplification circuit 93, and the reception-side amplification circuit 94 form a radio-frequency front end circuit 900.

The BBIC 91 performs various types of processing at a baseband frequency. The RFIC 92 performs radio-frequency processing regarding wireless communication. As a specific example, the RFIC 92 performs the generation of a transmission signal, the demodulation of a reception signal, and the like. Furthermore, the RFIC 92 demodulates the communication band information from a reception signal. A control signal for controlling variable impedance is outputted from the BBIC 91 or the RFIC 92.

A transmission signal outputted from the RFIC 92 is amplified by the transmission-side amplification circuit 93. The transmission-side amplification circuit 93 includes a PA and the like and amplifies a transmission signal. The amplified transmission signal is inputted to the transmission terminal Ptx of the multiplexer 70. The transmission signal is subjected to the filter processing at the frequency-variable filter 10, which is a transmission filter, and is outputted through the antenna terminal Pant. The transmission signal is transmitted to the antenna 96 via the antenna matching circuit 95, and is transmitted to the outside through the antenna 96.

The reception signal received at the antenna 96 is inputted to the antenna matching circuit 95 and the antenna terminal Pant of the multiplexer 70. The reception filter of the multiplexer 70 performs the filter processing on the reception signal, and outputs the processed reception signal through the reception terminal Prx. The reception signal is inputted to the reception-side amplification circuit 94. The reception-side amplification circuit 94 includes an LNA and the like. The reception-side amplification circuit 94 amplifies the reception signal and outputs the amplified reception signal to the RFIC 92.

The communication terminal 90 includes the multiplexer 70 described above. Thus, an attenuation at a common specific frequency outside the pass bands for the transmission signals of multiple communication bands can be ensured.

The configuration of the multiplexer 70A or 70B described above and the configuration of a multiplexer using the frequency-variable filter 10B or 10C may be applied to the communication terminal 90.

Furthermore, the number of series-arm resonators and parallel-arm resonators in a frequency-variable filter according to each of the embodiments described above may be set such that a circuit of a ladder shape can be formed. That is, at least a parallel-arm resonator connected in series with a variable capacitor, a parallel-arm resonator connected in series with an inductor having a fixed inductance, and a series-arm resonator that are connected in a ladder shape are required.

Furthermore, a mode in which the multiplexer described above is a duplexer has been described. However, a triplexer or the like may be used as a multiplexer. Furthermore, a multiplexer may solely include multiple transmission filters or solely include multiple reception filters. A multiplexer may include a transmission filter and a reception filter combined in an appropriate manner.

Furthermore, in each of the embodiments described above, a mode in which a variable capacitor is used for switching to a corresponding communication band has been described. However, other types of variable impedance elements such as a variable inductor or the like may be used.

10, 10A, 10B, and 10C: frequency-variable filter, 21: variable capacitor, 31, 31A, 31B, 31C, and 32C: inductor, 41: capacitor, 51: matching inductor, 60: reception filter, 70, 70A, 70B: multiplexer, 80: inductor, 90: communication terminal, 91: BBIC, 92: RFIC, 93: transmission-side amplification circuit, 94: reception-side amplification circuit, 95: antenna matching circuit, 96: antenna, 111, 111A, 112, 112A, 113, 113A, 114A, and 115A: series-arm resonator, 121, 121A, 122, 122A, 123, 123A, and 124A: parallel-arm resonator, 900: radio-frequency front end circuit, CH1 and CH2: communication band, fsr211, fsr211A, fsr212, fsr31, and fsr31A: attenuation pole frequency, P1: first terminal, P2: second terminal, Pant: antenna terminal, PC: common connection point, PrL21: parasitic inductor, Prx: reception terminal, Ptx: transmission terminal

The invention claimed is:

1. A ladder-type frequency-variable filter comprising:
a series-arm resonator;
a first parallel-arm resonator in a first parallel arm,
a second parallel-arm resonator in a second parallel arm,
a variable impedance element connected in series with the first parallel-arm resonator,
a first fixed inductor having a fixed inductance, wherein:
the series-arm resonator, the first parallel-arm resonator, and the second parallel arm resonator are connected according to a ladder configuration, no variable impedance element is connected in series with the second parallel-arm resonator, and
a third parallel-arm resonator in a third parallel arm,
wherein the first fixed inductor is connected to the second parallel-arm resonator and the third parallel-arm resonator.

2. A ladder-type frequency-variable filter comprising,
a series-arm resonator,
a first parallel-arm resonator in a first parallel arm,
a second parallel-arm resonator in a second parallel arm,
a variable impedance element connected in series with the first parallel-arm resonator; and
a first fixed inductor having a fixed inductance,
wherein:
the series-arm resonator, the first parallel-arm resonator, and the second parallel-arm resonator are connected according to a ladder configuration,
no variable impedance element is connected in series with the second parallel-arm resonator, and
the first fixed inductor is connected in series with the second parallel-arm resonator, and
wherein a frequency of an attenuation pole formed by a sub-resonance of the second parallel-arm resonator formed by the first fixed inductor overlaps a frequency of an attenuation pole formed by a sub-resonance point of the first parallel-arm resonator.

3. A ladder-type frequency-variable filter comprising,
a series-arm resonator,
a first parallel-arm resonator in a first parallel arm,
a second parallel-arm resonator in a second parallel arm,
a variable impedance element connected in series with the first parallel-arm resonator, and
a first fixed inductor having a fixed inductance,
wherein:
the series-arm resonator, the first parallel-arm resonator, and the second parallel-arm resonator are connected according to a ladder configuration,
no variable impedance element is connected in series with the second parallel-arm resonator, and
the first fixed inductor is connected in series with the second parallel-arm resonator, and
wherein a frequency of an attenuation pole formed by the first fixed inductor overlaps a frequency of a harmonic of a communication signal passing through the ladder-type frequency-variable filter.

4. The ladder-type frequency-variable filter according to claim 3, further comprising:
a third parallel-arm resonator in a third parallel arm,
wherein no variable impedance element is connected in series with the third parallel-arm resonator, and a second fixed inductor having a fixed inductance is connected in series with the third parallel-arm resonator.

5. A multiplexer comprising:
the ladder-type frequency-variable filter according to claim 3; and
a second filter,
wherein the ladder-type frequency-variable filter and the second filter are connected to a common node.

6. The multiplexer according to claim 5, wherein the second filter is a longitudinally-coupled resonator filter.

7. The multiplexer according to claim 5,
wherein the second filter includes a resonator, and
wherein the multiplexer further comprises a third fixed inductor having a fixed inductance, the third fixed inductor being connected between the common node and the second filter.

8. The multiplexer according to claim 7, wherein an attenuation pole of an LC series resonance circuit including the second filter and the third fixed inductor overlaps a frequency of an attenuation pole formed by a sub-resonance point of the first parallel-arm resonator of the ladder-type frequency-variable filter.

9. The multiplexer according to claim 7, wherein the second filter is a longitudinally-coupled resonator filter.

10. The multiplexer according to claim 5,
wherein the ladder-type frequency-variable filter is a transmission filter, and
wherein the second filter is a reception filter.

11. A radio-frequency front end circuit comprising:
the multiplexer according to claim 10;
a transmission-side amplification circuit that is connected to the transmission filter;
a reception-side amplification circuit that is connected to the reception filter; and
a radio frequency integrated circuit (RFIC) that is connected to the transmission-side amplification circuit and to the reception-side amplification circuit.

12. A communication terminal comprising:
the radio-frequency front end circuit according to claim 11; and
a baseband integrated circuit (IC) that is connected to the RFIC.

13. The multiplexer according to claim 5,
wherein the ladder-type frequency-variable filter is a reception filter, and
wherein the second filter is a transmission filter.

14. A radio-frequency front end circuit comprising:
the multiplexer according to claim 13;
a transmission-side amplification circuit that is connected to the transmission filter;
a reception-side amplification circuit that is connected to the reception filter; and
a radio frequency integrated circuit (RFIC) that is connected to the transmission-side amplification circuit and to the reception-side amplification circuit.

15. A communication terminal comprising:
the radio-frequency front end circuit according to claim 14; and
a baseband integrated circuit (IC) that is connected to the RFIC.

* * * * *